United States Patent [19]
Fandrich et al.

[11] Patent Number: 5,835,927
[45] Date of Patent: *Nov. 10, 1998

[54] SPECIAL TEST MODES FOR A PAGE BUFFER SHARED RESOURCE IN A MEMORY DEVICE

[75] Inventors: Mickey L. Fandrich, Placerville; Salim B. Fedel, Folsom; Ranjeet Alexis, Citrus Heights; Mamun Rashid, Fairfield, all of Calif.

[73] Assignee: Intel Corporation, Santa Clara, Calif.

[ * ] Notice: The term of this patent shall not extend beyond the expiration date of Pat. No. 5,623,620.

[21] Appl. No.: 719,583

[22] Filed: Sep. 25, 1996

Related U.S. Application Data

[63] Continuation of Ser. No. 85,542, Jun. 30, 1993, Pat. No. 5,623,620.

[51] Int. Cl.$^6$ ............................................. G06F 12/00
[52] U.S. Cl. ............................................. 711/2; 711/147
[58] Field of Search .................... 365/201; 711/2, 711/5, 202, 103, 209, 147, 157

[56] References Cited

U.S. PATENT DOCUMENTS

| | | | |
|---|---|---|---|
| 5,053,990 | 10/1991 | Kreifels et al. | 711/103 |
| 5,065,364 | 11/1991 | Atwood et al. | 365/185.13 |
| 5,126,808 | 6/1992 | Montalvo et al. | 365/185.09 |
| 5,155,833 | 10/1992 | Cullison et al. | 395/652 |
| 5,159,672 | 10/1992 | Salmon et al. | 711/167 |
| 5,177,745 | 1/1993 | Rozman | 371/21.1 |
| 5,222,046 | 6/1993 | Kreifels et al. | 365/230.06 |
| 5,224,070 | 6/1993 | Fandrich et al. | 365/185.33 |
| 5,233,559 | 8/1993 | Brennan, Jr. | 365/185.09 |
| 5,245,572 | 9/1993 | Kosonocky et al. | 365/185.11 |
| 5,249,158 | 9/1993 | Kynett et al. | 365/185.11 |
| 5,265,059 | 11/1993 | Wells et al. | 365/185.25 |
| 5,299,162 | 3/1994 | Kim et al. | 365/189.11 |
| 5,353,256 | 10/1994 | Fandrich et al. | 365/185.11 |
| 5,355,464 | 10/1994 | Fandrich et al. | 365/218 |
| 5,369,754 | 11/1994 | Fandrich et al. | 711/103 |
| 5,377,199 | 12/1994 | Fandrich et al. | 371/22.31 |
| 5,623,620 | 4/1997 | Fandrich et al. | 711/202 |

Primary Examiner—Jack A. Lane
Attorney, Agent, or Firm—Blakely, Sokoloff, Taylor & Zafman

[57] ABSTRACT

A flash memory device having a page buffer circuit with special testing modes. The page buffer circuit comprises a plane A and a plane B, each comprising a static random access memory array. The page buffer circuit further comprises a mode control circuit that maps the plane A and the plane B as a contiguous extended memory space accessible over a host bus. The page buffer circuit also maps the plane A and the plane B as a control store for a flash array controller of the flash memory device.

14 Claims, 14 Drawing Sheets

| MODE | DESCRIPTION |
|---|---|
| 000 | DISABLE |
| 001 | RUN FAC FROM PAGE BUFFER |
| 010 | IC READS FROM A PLANE-USER MODE |
| 011 | IC WRITES TO A PLANE-USER MODE |
| 100 | FAC READS FROM A PLANE |
| 101 | FAC WRITES TO A PLANE |
| 110 | IC READS IN TEST MODE-EXTENDED SPACE |
| 111 | IC WRITES IN TEST MODE-EXTENDED SPACE |

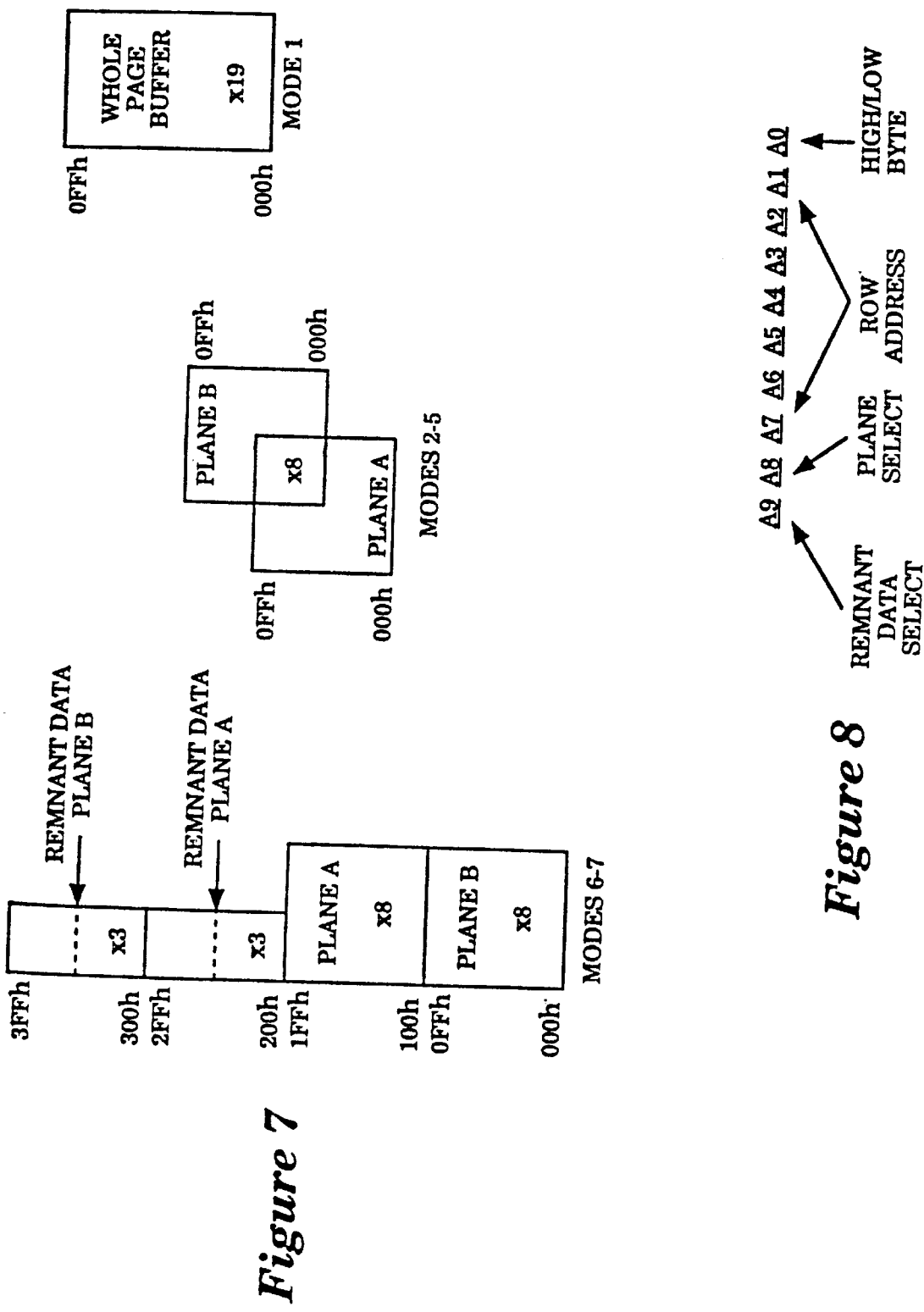

| FAC OVERRIDE | FAC PLANE STATUS | FAC PLANE SEL | FAC PLANE ASSIGNMENT |
|---|---|---|---|
| 00 | 1 | 0 | PLANE A |
| 00 | 1 | 1 | PLANE B |
| 01 | x | x | PLANE A |
| 10 | x | x | PLANE B |
| 11 | x | x | REMNANT BITS IN PLANE A AND B |

*Figure 9*

| TEST MODE EXTEND | IC PLANE SELECT | IC PLANE STATUS | IC PLANE ASSIGNMENT |
|---|---|---|---|
| 1 | x | x | PLANE A AND PLANE B INCLUDING REMNANT BITS |
| 0 | 0 | 1 | PLANE A |
| 0 | 1 | 1 | PLANE B |

*Figure 10*

| | INPUTS | | | | | | OUTPUTS |
|---|---|---|---|---|---|---|---|
| PLANE_B MODE [2:0] | FAC OVERRIDE [1:0] | FAC ADDR [0] | IC ADDR [9:8] | IC ADDR [0] | FAC BYTE | IC BYTE | PLANE_B SELECT [2:0] |
| 000 | xx | x | x | x | x | x | 000 |
| 01x | xx | x | x | 0 | x | 1 | 001 |
| 01x | xx | x | x | 1 | x | 1 | 010 |
| 01x | xx | x | x | x | x | 0 | 011 |
| 10x | 00 | 0 | x | x | 1 | x | 001 |
| 10x | 00 | 1 | x | x | 1 | x | 010 |
| 10x | 00 | x | x | x | 0 | x | 011 |
| 10x | 01,10 | x | 0 | x | x | x | 001 |
| 10x | 01,10 | x | 1 | x | x | x | 010 |
| 10x | 11 | x | x | x | x | x | 001 |
| 11x | xx | x | 11 | x | x | x | 100 |
| 11x | xx | x | 01 | 0 | x | x | 100 |
| 11x | xx | x | 01 | 1 | x | x | 001 |
| 001 | xx | x | x | x | x | x | 010 |
| | | | | | | | 111 |

*Figure 11*

| INPUTS | | | | | | | OUTPUTS |
|---|---|---|---|---|---|---|---|
| PLANE_A MODE [2:0] | FAC OVERRIDE [1:0] | FAC ADDR [0] | IC ADDR [9:8] | IC ADDR [0] | FAC BYTE | IC BYTE | PLANE_A SELECT [2:0] |
| 000 | xx | x | x | x | x | x | 000 |
| 01x | xx | x | x | 0 | x | 1 | 001 |
| 01x | xx | x | x | 1 | x | 1 | 010 |
| 01x | xx | x | x | x | x | 0 | 011 |
| 10x | 00 | 0 | x | x | 1 | x | 001 |
| 10x | 00 | 1 | x | x | 1 | x | 010 |
| 10x | 00 | x | x | x | 0 | x | 011 |
| 10x | 01,10 | x | 0 | x | x | x | 001 |
| 10x | 01,10 | x | 1 | x | x | x | 010 |
| 10x | 11 | x | x | x | x | x | 100 |
| 11x | xx | x | 10 | x | x | x | 100 |
| 11x | xx | x | 00 | 0 | x | x | 001 |
| 11x | xx | x | 00 | 1 | x | x | 010 |
| 001 | xx | x | x | x | x | x | 111 |

*Figure 12*

| INPUTS | | | | OUTPUTS | |
|---|---|---|---|---|---|
| PLANE_A MODE [2:0] | PLANE_A SELECT [2:0] | PLANE_B MODE [2:0] | PLANE_B SELECT [2:0] | IC DATA[15:8] | IC DATA[7:0] |
| _10 | 001 | xxx | xxx | PLANE_A DATA[7:0] | PLANE_A DATA[7:0] |
| _10 | 010 | xxx | xxx | PLANE_A DATA[15:8] | PLANE_A DATA[15:8] |
| _10 | 011 | xxx | xxx | PLANE_A DATA[15:8] | PLANE_A DATA[7:0] |
| _10 | 100 | xxx | xxx | 0::5 & PLANE_A DATA[18:16] | 0::5 & PLANE_A DATA[18:16] |
| xxx | xxx | _10 | 001 | PLANE_B DATA[7:0] | PLANE_B DATA[7:0] |
| xxx | xxx | _10 | 010 | PLANE_B DATA[15:8] | PLANE_B DATA[15:8] |
| xxx | xxx | _10 | 011 | PLANE_B DATA[15:8] | PLANE_B DATA[7:0] |
| xxx | xxx | _10 | 100 | 0::5 & PLANE_B DATA[18:16] | 0::5 & PLANE_B DATA[18:16] |
| ALL OTHERS | xxx | ALL OTHERS | xxx | NOT DRIVEN | NOT DRIVEN |

| INPUTS | | | | OUTPUTS | |
|---|---|---|---|---|---|
| PLANE_A MODE [2:0] | PLANE_A SELECT [2:0] | PLANE_B MODE [2:0] | PLANE_B SELECT [2:0] | FAC DATA [15:8] | FAC DATA [7:0] |
| 100 | 001 | xxx | xxx | PLANE_A DATA[7:0] | PLANE_A DATA[7:0] |
| 100 | 010 | xxx | xxx | PLANE_A DATA[15:8] | PLANE_A DATA[15:8] |
| 100 | 011 | xxx | xxx | PLANE_A DATA[15:8] | PLANE_A DATA[7:0] |
| 100 | 100 | xxx | xxx | 0::5 & PLANE_A DATA[18:16] | 0::5 & PLANE_A DATA[18:16] |
| xxx | xxx | 100 | 001 | PLANE_B DATA[7:0] | PLANE_B DATA[7:0] |
| xxx | xxx | 100 | 010 | PLANE_B DATA[15:8] | PLANE_B DATA[15:8] |
| xxx | xxx | 100 | 100 | 0::5 & PLANE_B DATA[18:16] | 0::5 & PLANE_B DATA[18:16] |
| xxx | xxx | 100 | 011 | PLANE_B DATA[15:8] | PLANE_B DATA[7:0] |
| ALL OTHERS | xxx | ALL OTHERS | xxx | NOT DRIVEN | NOT DRIVEN |

*Figure 15*

| INPUTS | | OUTPUTS |
|---|---|---|
| PLANE_A MODE [2:0] | PLANE_B MODE [2:0] | FAC INSTRUCTION [18:0] |
| 001 | xxx | PLANE_A DATA[18:0] |
| xxx | 001 | PLANE_B DATA[18:0] |
| ALL OTHERS | ALL OTHERS | NOT DRIVEN |

*Figure 16*

SPECIAL TEST MODES FOR A PAGE BUFFER SHARED RESOURCE IN A MEMORY DEVICE

This is a continuation of application Ser. No. 08/085,542, filed Jun. 30, 1993, U.S. Pat. No. 5,623,620.

FIELD OF THE INVENTION

The present invention pertains to the field of integrated circuit memory devices. More particularly, this invention relates to special testing modes for a shared page buffer resource in a flash memory device.

BACKGROUND

A flash memory device contains a flash cell array for nonvolatile random access data storage in a computer system. Prior flash memory devices usually implement a write control circuit for programming and erasing areas of the flash cell array. The write control circuit typically programs the flash cells by applying a predetermined sequence of program level voltages to the flash cells.

A flash memory device may employ an on-chip programming data buffer to increase programming throughput to the flash cell array. The data buffer enables increased programming speed by buffering a set of programming data. The data buffer enables fast access to the programming data by the write control circuit. The fast access to the programming data enables the write control circuit to amortize the cycling of program level voltages across multiple bytes in the flash cell array.

In addition, a flash memory device may employ a multiple page interleaved programming data buffer to achieve further increases in programming throughput to the flash cell array. The interleaved programming data buffer enables an input/output driver to load one page while the write control circuit programs from another page. However, an interleaved programming data buffer increases the cost and complexity of flash memory device testing and diagnostics.

SUMMARY AND OBJECTS OF THE INVENTION

One object of the present invention is to provide testing modes for a shared page buffer resource between a user and a flash array controller of the flash memory device.

Another object of the present invention is to provide a control store mode for the page buffer shared resource, wherein the page buffer functions as a control store for the flash array controller.

Another object of the present invention is to provide a page buffer resource having high byte columns, low byte columns, and remnant columns, and to map the columns into a contiguous extended memory space accessible by a user.

These and other objects of the invention are provided by a flash memory device comprising a flash array controller circuit for performing program or erase operations on a flash cell array of the flash memory device and a page buffer circuit having special testing modes. The page buffer circuit comprises a set of page planes. The page planes each comprise a static random access memory array. The page buffer circuit further comprises a mode control circuit coupled to receive an extended mode signal and a control store mode signal. The extended mode signal causes the mode control circuit to map the page planes as a contiguous memory space accessible over a host bus. The control store mode signal causes the mode control circuit to map the page planes as a control store for the flash array controller accessible over an instruction bus.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 7 illustrates the address mapping of the page buffer circuit for modes 1–7;

FIG. 8 illustrates the address bit fields for accessing the page buffer circuit, wherein the address bits shown are transferred over the FAC address bus, the IC address bus, or the FAC program counter bus according to the mode;

FIG. 9 illustrates the FAC plane assignment of the Plane A and the Plane B for accesses by the flash array controller;

FIG. 10 illustrates the assignment of the Plane A and the Plane B for accesses by the interface circuit;

FIG. 11 is a truth table showing the states of the plane_B select which is generated by the column select circuit;

FIG. 12 is a truth table showing the states of the plane_A select which is generated by the column select circuit;

FIG. 14 is a truth table for the output data aligner circuit that illustrates the data transferred over the IC data bus according to the mode;

FIG. 15 is a truth table for the output data aligner circuit showing the data transferred over the FAC data bus according to the mode;

FIG. 16 is a truth table for the output data aligner circuit showing the data transferred over the FAC instruction bus according to the mode.

DETAILED DESCRIPTION

Figure 1:
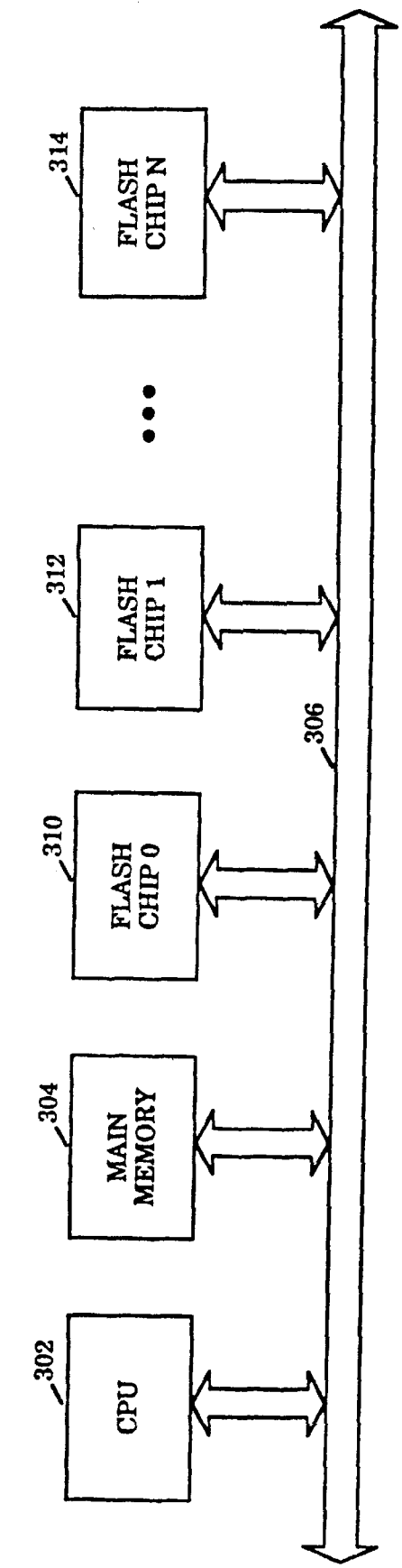
FIG. 1 is a block diagram of a computer system including a central processing unit (CPU), a main memory subsystem, and a set of flash memory devices.

FIG. 1 is a block diagram of a computer system 300. The computer system 300 is comprised of a central processing unit (CPU) 302, a main memory subsystem 304, and a set of flash memory devices 310–314. The CPU 302 communicates with the main memory subsystem 304 and the flash memory devices 310–314 over a host bus 306.

The flash memory devices 310–314 provide random access non volatile large scale data storage for the computer system 300. The CPU 302 reads the contents of the flash memory devices 310–314 by generating read memory cycles over the host bus 306. The CPU 302 writes to the flash memory devices 310–314 by transferring write commands and write data blocks to the flash devices 310–314 over the host bus 306.

Figure 2:
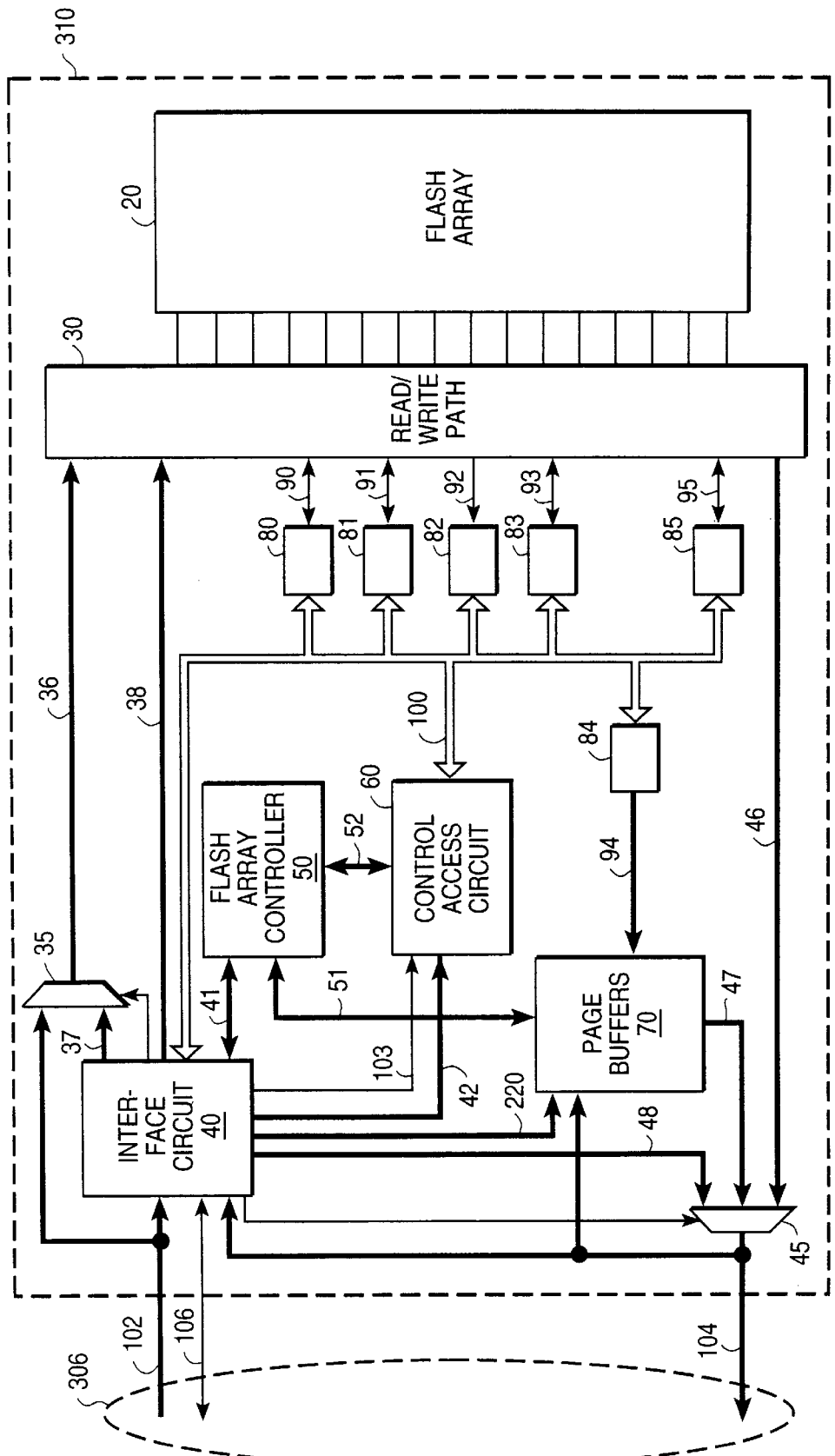
FIG. 2 is a block diagram of the flash memory device including a flash cell array, an interface circuit, a flash array controller, a set of page buffers, a set of control register circuits, and a set of read/write path circuitry.

FIG. 2 is a block diagram of the flash memory device 310. The flash memory device 310 is comprised of a flash cell array 20, an interface circuit 40, a flash array controller 50, a set of page buffer circuit 70, a set of control register circuits 80–85, and a set of read/write path circuitry 30.

The flash cell array 20 provides random access non volatile large scale data storage. For one embodiment, the flash cell array 20 is arranged as a set of 32 flash array blocks. Each flash array block provides 64 k bytes of data storage.

The flash memory device 310 is shown coupled to the host bus 306. The host bus 306 comprises a user address bus 102, a user data bus 104, and a user control bus 106.

The read/write path circuitry 30 comprises read and write path circuitry for accessing the flash array 20. For example, the read/write path circuitry 30 includes row and column address decoding circuitry for the flash array 20. The read/write path circuitry 30 also includes redundancy circuitry for overriding addresses if a bad flash cell is detected in the flash array 20. The read/write path circuitry 30 also includes mini array circuitry for generating reference flash bits, and sense path circuitry for comparing the reference flash bits to bits from the flash array 20 to determine whether the bits are logic state 1 or logic state 0.

The read/write path circuitry 30 also includes multiplexer circuitry for selecting between bits from the flash array 20 and redundant bits, as well as multiplexer circuitry for selecting between the high and low bytes of the flash array 20 to provide for 8 bit and 16 bit accesses. The read/write path circuitry 30 includes output buffer circuitry for driving data from the flash array 20 over output pads of the flash memory device 310.

The read/write path circuitry 30 includes address transition detection circuitry. The address transition detection circuitry generates control pulses when address transitions are detected. The control pulses are employed to speed column charging at the outputs of the flash array 20 before data is ready.

The read/write path circuitry 30 includes high voltage circuitry for accessing the flash array 20. For example, the read/write path circuitry 30 includes VPX switching circuitry for setting the wordline voltage for programming data into the flash array 20, and VPY generator circuitry for setting the programming load line. The read/write path circuitry 30 also includes VSI generator circuitry for setting the source voltage of unselected blocks of the flash array 20 during programming.

The read/write path circuitry 30 also includes digital to analog conversion circuits for generating reference voltage levels for program verify operations, as well as erase verify and post erase repair operations. The read/write path circuitry 30 also includes VPS switch circuitry for setting the source voltage level to VPP during erase operations.

The control register circuits 80–85 contain sets of specialized control registers and associated circuitry for controlling a read/write path 30. The specialized control registers are programmed and accessed over a central control bus 100.

The interface circuit 40 enables access of the flash cell array 20 over the host bus 306 by receiving and processing commands over the host bus 306. The interface circuit 40 receives commands over the user data bus 104, verifies the commands, and queues the commands to the flash array controller 50 over a queue bus 41. Thereafter, the flash array controller 50 executes the command using the appropriate portion of the flash memory device 310.

The flash array controller 50 is a specialized reduced instruction set processor for performing write operations on the flash array 20. The flash array controller 50 includes an arithmetic logic unit, general purpose registers, a control store and a control sequencer. The flash array controller 50 uses the commands received over the queue bus 41 to dispatch to the appropriate location of the control store to execute the command.

A control access circuit 60 enables both the interface circuit 40 and the flash array controller 50 to access the control register circuits 80–85 over the central control bus 100. During a normal mode of the flash memory device 310, the flash array controller 50 controls the control access circuit 60 and accesses the control register circuits 80–85 over the central control bus 100.

The flash array controller 50 writes to the specialized control registers by transferring a write control signal, and a register address along with corresponding write data to the control access circuit 60 over a bus 52. The control access circuit 60 then generates a write cycle over the central control bus 100 to program the addressed specialized control register. The flash array controller 50 reads the specialized control registers by transferring a register address and read control signal to the control access circuit 60 over the bus 52. The control access circuit 60 then generates a read access cycle over the central control bus 100 to read the addressed specialized control register.

The control register circuit 80 contains specialized control registers and circuitry for controlling the high voltage circuitry of the read/write path 30 according to a set of control signals 90. The high voltage control registers include source switch interface registers, interface registers for controlling VPX and VPIX multiplexers, VPP/VCC switch interface registers, interface registers for controlling reference generators, multiplexers and comparators, and programming data path interface registers.

The control register circuit 81 contains control registers and circuitry for controlling special column access circuitry of the read/write path 30 according to a set of control signals 91. The special column access control registers include mini-array interface registers, redundancy interface registers, imprint interface registers, and content addressable memory interface registers.

The control register circuit 82 contains a set of read only registers for sensing and latching a set of status signals 92 from the read/write path 30. The status signals 92 include the outputs of TTL buffers corresponding to input pads of the flash memory device 310, outputs of the sense amplifiers for the flash cell array 20, page buffer counter outputs, outputs of the comparators in the read/write path 30, and the flash array controller 50 program counter.

The control register circuit 83 contains control registers and circuitry for controlling the read path of the read/write path 30 according to a set of control signals 93. The read path control registers include automatic transition detection interface registers, sensing interface registers, x, y, and z path interface registers, and c path interface registers.

The control register circuit 84 contains registers for controlling a set of test modes of the page buffer circuit 70. The control registers in the control register circuit 84 generate a set of test mode control signals 94. The control registers in the control register circuit 84 are programmed over the central control bus 100 by the flash array controller 50 or the interface circuit 40.

The control register circuit 85 contains registers for controlling special test features of the flash memory device 310 according to a set of control signals 95. The special test registers include test mode access registers, VPP capture registers, ready and busy modifier registers, and address allocation registers.

The interface circuit 40 controls an input address multiplexer 35 to select an input address 36 for the read/write path 30. The selected input address 36 is either the address sensed by TTL buffers (not shown) on the user address bus 102, or a latched address 37 from the interface circuit 40.

The interface circuit 40 controls an output data multiplexer 45 to select a source for output data transfer over the user data bus 104. The selected output data is either flash array data 46 from the read/write path 30, page buffer data 47 from the page buffer circuit 70, or block status register (BSR) data 48 from a set of block status registers contained within the interface circuit 40.

The CPU 302 reads the flash cell array 20 by transferring addresses over the user address bus 102 while signaling read cycles over the user control bus 106. The interface circuit 40 detects the read cycles and causes the input address multiplexer 35 to transfer the addresses from the user address bus 102 through to the x and y decode circuitry of the read/write path 30. The interface circuit 40 also causes the output data multiplexer 45 to transfer the addressed read data from the read/write path 30 over the user data bus 104.

The CPU 302 writes data to the flash cell array 20 by generating I/O write cycles over the host bus 306 to transfer programming data blocks to the page buffer circuit 70. The CPU 302 then transfers a program with page buffer command to the interface circuit 40. The interface circuit 40 verifies the program with page buffer command, and queues the command to the flash array controller 50. The flash array controller 50 executes the write command by reading the programming data from the page buffers over a controller bus 51, and by programming the appropriate areas of the flash array 20. The CPU 302 also transfers write commands to the flash device 310 to program individual bytes or words of the flash array 20.

The flash array controller 50 implements algorithms for sequencing the high voltage circuitry of the read/write path 30 in order to apply charge to the flash cells of the flash cell array 20 and remove charge from the flash cells of the flash cell array 20. The flash array controller 50 controls the high voltage circuitry and addresses the flash array 20 by accessing the control register circuits 80–85 over the central control bus 100.

The read/write path 30 includes source switch circuitry for applying the appropriate voltage levels to the flash cell array 20 for an erase function. The read/write path 30 also includes program load circuitry for driving program level voltages onto the bit lines of the flash cell array 20 during a programming function.

The interface circuit 40 contains 32 block status registers. Each block status register corresponds to one of the blocks of the flash cell array 20. The flash array controller 50 maintains status bits in the block status registers to indicate the status of each block of the flash cell array 20. The CPU 302 reads the contents of the block status registers over the host bus 306.

Figure 3:
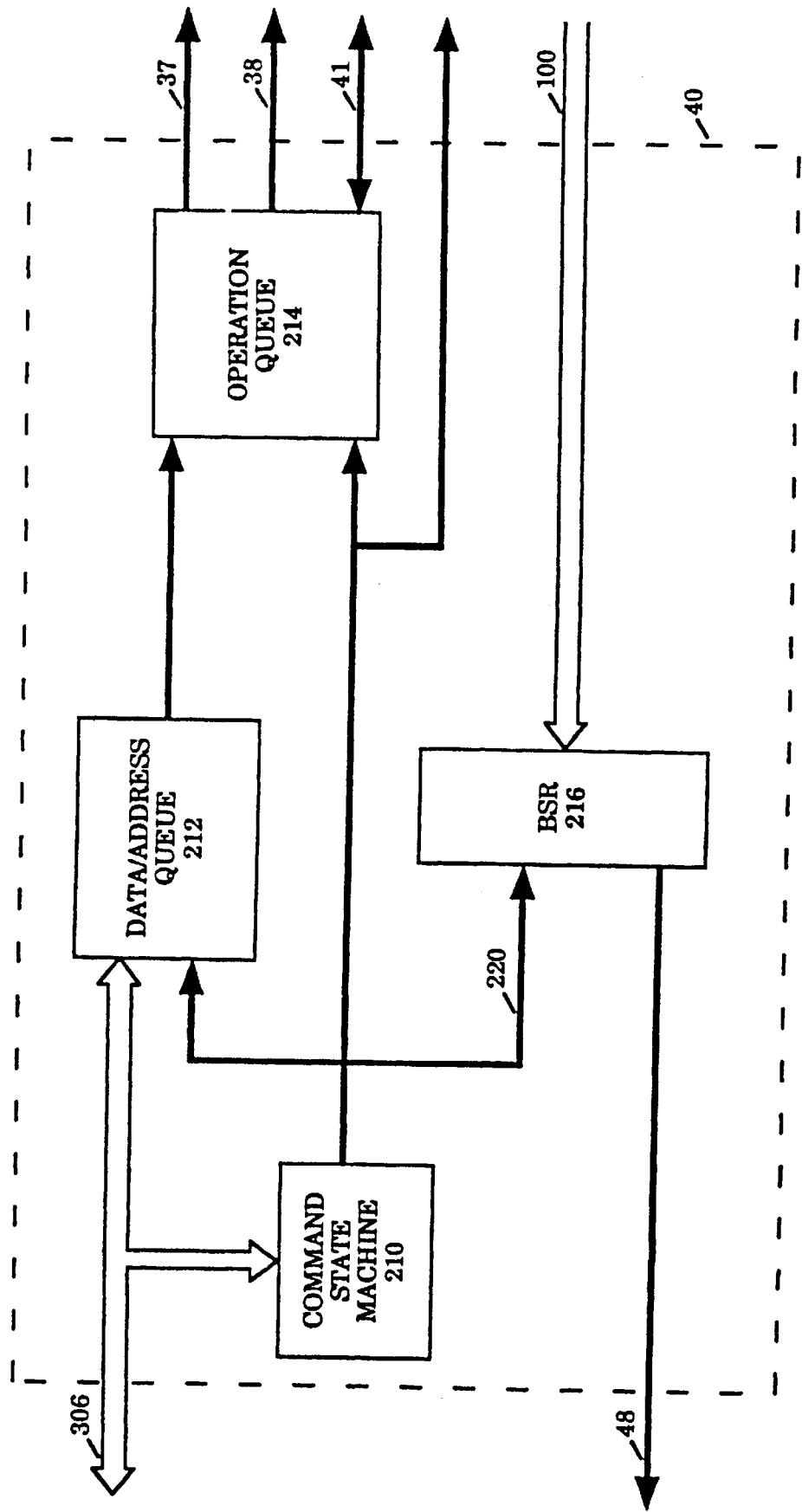
FIG. 3 is a block diagram of the interface circuit comprising a command state machine, a data/address queue, an operation queue, and a set of block status registers (BSR)

FIG. 3 is a block diagram of the interface circuit 40. The interface circuit 40 is comprised of a command state machine 210, a data/address queue 212, an operation queue 214, and a set of block status registers (BSR) 216.

The command state machine 210 receives commands from the CPU 302 over the host bus 306. The commands from the CPU 302 include commands for performing program or erase operation on individual bytes or words of the flash array 20, as well as commands for performing program or erase operations with data stored in the page buffer circuit 70.

The command state machine 210 verifies the commands, and transfers commands and associated parameters to the flash array controller 50 through the operation queue 214. The command state machine 210 also transfers control signals over a command bus 220 to control a set of modes for the page buffer circuit 70.

The command state machine 210 processes commands for reading the status registers of the BSR 216. The command state machine 210 selects the status registers of the BSR 216 by transferring addresses and control signals to the BSR 216 over a command bus 220. The status registers of the BSR 216 include a global status register that indicates the status of the page buffer circuit 70.

The operation queue 214 transfers the latched addresses 37 from the data/address queue 212 to the input multiplexer 35. The operation queue 214 also transfers the latched array data 38 from the data/address queue 212 to the read/write path 30. The operation queue 214 transfers the verified commands and associated parameters to the flash array controller 50 over the queue bus 41.

The BSR 216 contains a block status register for each of the flash array blocks of the flash array 20. Each block status register in the BSR 216 stores status bits that provide block specific status information to a user.

The flash array controller 50 maintains the status bits in the status registers of the BSR 216. The flash array controller 50 accesses the status registers of the BSR 216 over the central control bus 100. The flash array controller 50 performs both reads and writes to the BSR 216 over the central control bus 100.

The interface circuit 40 enables read access of the status registers over the host bus 306. The CPU 302 reads the status registers of the BSR 216 by transmitting read status register commands to the command state machine 210 over the host bus 306. The read block status register commands include a status register address for selecting the 32 block status registers in the BSR 216.

The command state machine 210 transfers the status register address over the command bus 220 to select the status registers the BSR 216. The contents of the selected status register are transferred from the BSR 216 to the output multiplexer 45 over the BSR data bus 48. The command state machine 210 causes the output multiplexer 45 to transfer the status register read data on the BSR data bus 48 over the user data bus 104.

Figure 4:
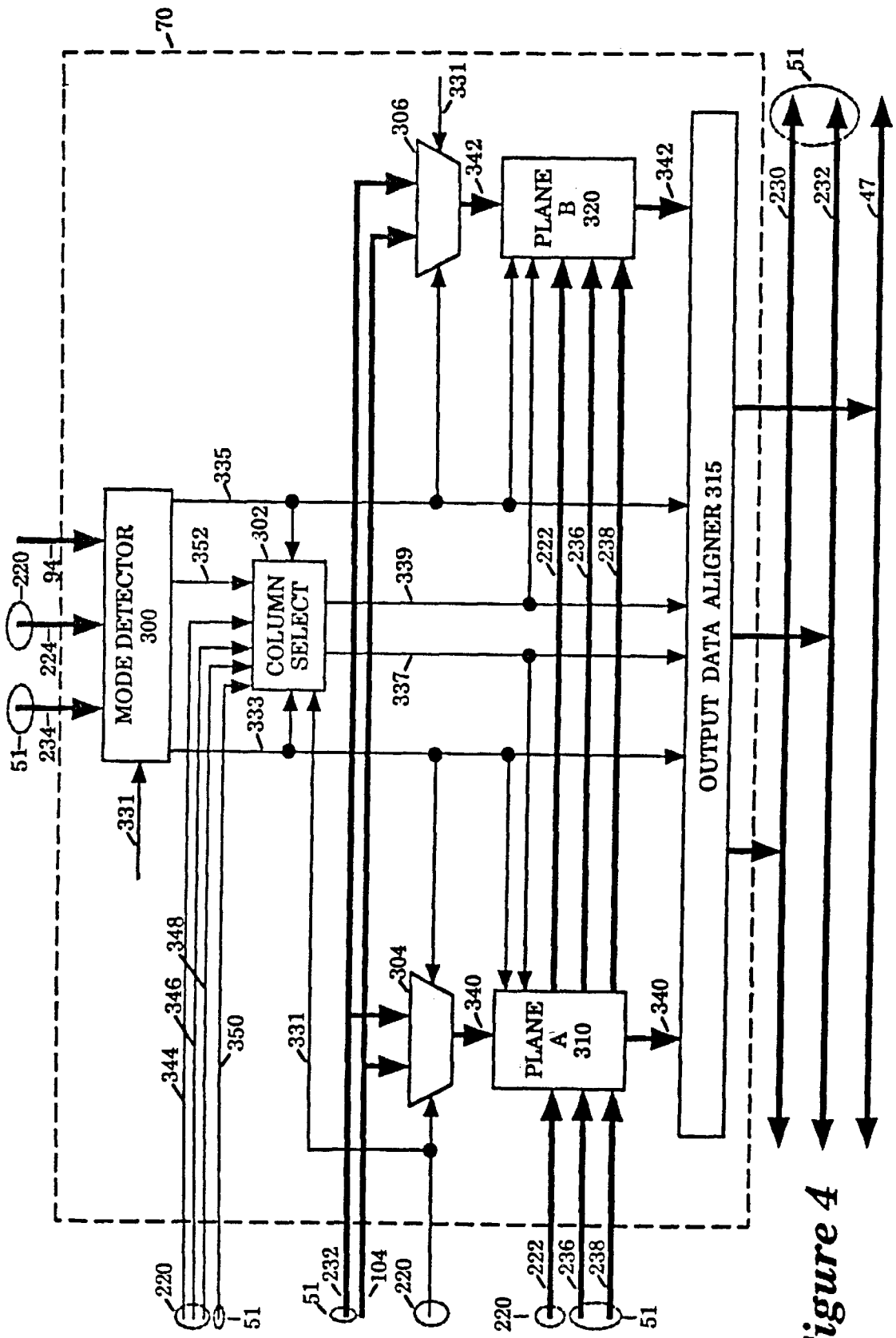
FIG. 4 is a block diagram illustrating the page buffer circuit which is comprised of two separate 256 by 8 bit static random access memory (SRAM) planes and remnant bits.

FIG. 4 is a block diagram illustrating the page buffer circuit 70. The page buffer circuit 70 is comprised of two separate 256 by 8 bit static random access memory (SRAM) planes and a 128 by 3 bit remnant bit SRAM. The two SRAM planes comprise a Plane A 310 and a Plane B 320.

The command bus 220 is shown comprising an interface circuit (IC) address bus 222, a set of IC control signals 224, and IC byte signal 344. The controller bus 51 is shown comprising a flash array controller (FAC) data bus 232, an FAC address bus 236, an FAC program counter bus 238, an FAC instruction bus 230, and a set of FAC control signals 234.

The rows of the Plane A 310 and the Plane B 320 are addressed over the IC address bus 222, the FAC address bus 236, and the FAC program counter bus 238. The command state machine 210 addresses the Plane A 310 and the Plane B 320 over the IC address bus 222. The flash array controller 50 addresses the Plane A 310 and the Plane B 320 during data accesses over the FAC address bus 236. The flash array controller 50 addresses the Plane A 310 and the Plane B 320 during instruction fetches over the FAC program counter bus 238.

The page buffer circuit 70 is also comprised of a mode detector circuit 300, a column select circuit 302, a pair of input multiplexers 304 and 306, and an output data aligner circuit aligner 315.

Figures 5, 6:
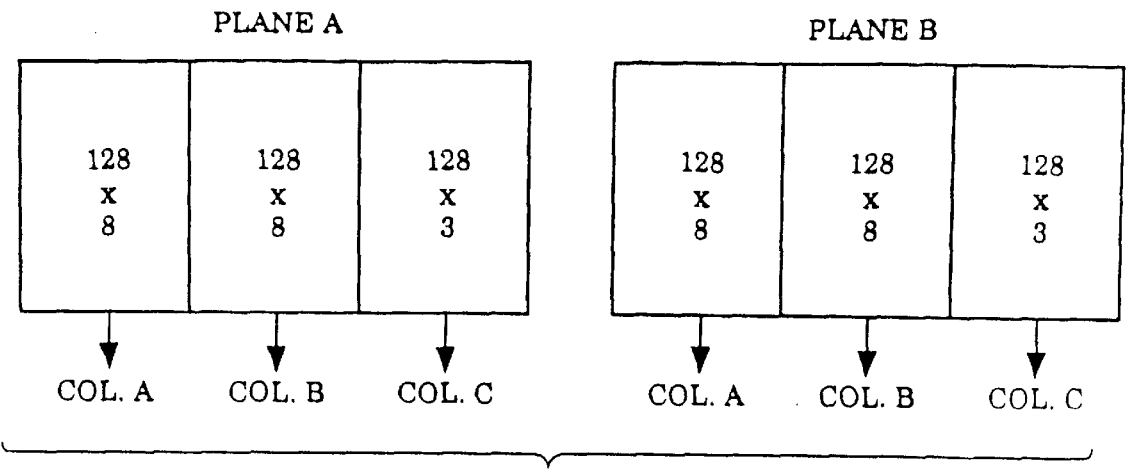
FIG. 5 illustrates the architecture of the Plane A and the Plane B which are each comprised of two 128×8 bit columns (columns A and B) and one 128×3 bit column (column C)
FIG. 6 illustrates the modes of the page buffer circuit wherein the modes comprise modes 0 through 7.

FIG. 5 illustrates the architecture of the Plane A 310 and the Plane B 320. The Plane A 310 and the Plane B 320 are each comprised of two 128×8 bit columns (col. A and col. B) and one 128×3 bit column (col. C). The column A and B store byte or word values. The column C stores remnant bits for special test modes of the page buffer circuit 70.

FIG. 6 illustrates the modes of the page buffer circuit 70, for one embodiment. The operating modes of each plane of the page buffer circuit 70 comprise modes 0 through 7.

In mode 0, access to a page buffer plane is disabled. A page buffer plane is not accessible by the user or the flash array controller 50.

In mode 1, the page buffer planes function as a control store for the flash array controller 50 in a special test mode. The flash array controller 50 fetches an instruction by transferring an instruction address to the page buffer circuit 70 over the FAC address bus 236. The flash array controller 50 receives the corresponding instruction from the page buffer circuit 70 over the FAC instruction bus 230.

In mode 2, the interface circuit 40 reads the page buffer planes in user mode. The interface circuit 40 receives a read page buffer command over the host bus 306. The read page buffer command specifies a read address for a page buffer plane. The command state machine 210 transfers the read address to the page buffer circuit 70 over the IC address bus 222. The page buffer circuit 70 transfers the corresponding read data over the page buffer data bus 47. The interface circuit 40 causes the multiplexer 45 to transfer the read data over the user data bus 104.

In mode 3, the interface circuit 40 writes to the page buffer planes in user mode. A user mode write to a page buffer plane is either a write byte/word transaction or a write sequential transaction. The write byte/word transaction to a page buffer plane begins when the interface circuit 40 receives a write page buffer command over the host bus 306. The write page buffer command specifies a write address for a page buffer plane, as well as a write data value. The command state machine 210 transfers the write address to the page buffer circuit 70 over the IC address bus 222. The page buffer circuit 70 receives the write data value over the user data bus 104.

A write sequential transaction to a page buffer plane begins when the interface circuit 40 receives a write page buffer sequential command over the host bus 306. The write page buffer sequential command specifies a starting address for a page buffer plane, as well as a byte count. The interface circuit 40 contains a write counter circuit (not shown). The write counter circuit is loaded with the byte count upon receipt of the write page buffer sequential command. Thereafter, the write counter circuit counts down as the page buffer circuit 70 receives write data values over the user data bus 104. While the write data values are being received, the command state machine 210 addresses the page buffer circuit 70 over the IC address bus 222 according to the write counter circuit.

In mode 4, the flash array controller 50 reads from a page buffer plane. For example, the flash array controller 50 reads programming data from a page buffer plane during a program with page buffer operation. The flash array controller 50 addresses the page buffer circuit 70 over the FAC address bus 236. The flash array controller 50 receives the corresponding programming data from the page buffer circuit 70 over the FAC data bus 232.

In mode 5, the flash array controller 50 writes to a page buffer plane. The flash array controller 50 addresses the page buffer circuit 70 over the FAC address bus 236, and transfers the corresponding write data to the page buffer circuit 70 over the FAC data bus 232.

In mode 6, the interface circuit 40 reads the page buffer planes in a special test mode having an extended space. The interface circuit 40 receives a read page buffer command specifying a read address over the host bus 306. The command state machine 210 transfers the read address to the page buffer circuit 70 over the IC address bus 222, and the page buffer circuit 70 transfers the corresponding read data over the page buffer data bus 47.

In mode 7, the interface circuit 40 writes to the page buffer planes in the special test mode having the extended space. The interface circuit 40 receives a write page buffer command specifying a write address and a write data value over the host bus 306. The command state machine 210 transfers the write address to the page buffer circuit 70 over the IC address bus 222. The page buffer circuit 70 receives the write data value over the user data bus 104.

FIG. 7 illustrates the address mapping of the page buffer circuit 70 for each mode. In mode 1, the whole page buffer comprising columns A, B and C of the Plane A 310 and columns A, B and C of the Plane B 320 is mapped into a 256 by 19 bit control store. In mode 1, the page buffer circuit 70 functions as a 256 entry control store for the flash array controller 50.

In modes 2 through 5, the page buffer planes are mapped into two independent planes (PLANE A and PLANE B). PLANE A and PLANE B are each 256 by 8 bits. PLANE A and PLANE B may be accessed in eight bit mode or in sixteen bit mode by either the interface circuit 40 or the flash array controller 50. In modes 2 through 5, the interface circuit 40 coordinates access to PLANE A and PLANE B according to commands received over the host bus 306. The interface circuit 40 ensures that both the interface circuit 40 and the flash array controller 50 do not access the same plane.

In modes 4 and 5, the flash array controller 50 optionally asserts the FAC override bits to perform byte accesses of the page buffer planes, as well as accesses of the remnant column.

In modes 6 and 7, PLANE A and PLANE B are mapped into one contiguous extended memory space. The extended memory space includes columns A, B and C of the Plane A 310 and columns A, B and C of the Plane B 320. Modes 6 and 7 comprise special test modes for testing the page buffer circuit 70.

FIG. 8 illustrates the address bit fields for accessing the page buffer circuit 70. The address bits shown are transferred over the FAC address bus 236, the IC address bus 222, or the FAC program counter bus 238 according to the mode.

Address bit A9 functions as a remnant data select for selecting column C of the Plane A 310 and the Plane B 320 in modes 6–7. Address bit A8 functions as a plane select for selecting either the Plane A 310 or the Plane B 320. Address bits A7 through A1 select a row of the Plane A 310 and the Plane B 320. Address bit A0 selects either the high byte or the low byte of a row.

Address bit A7 is a plane select in mode 1. If the FAC override bits are not equal to 00, address bit A0 selects between Plane A or Plane B remnant bits.

The mode detector circuit 300 determines the mode for the page buffer circuit 70. The mode detector circuit 300 generates a plane_A mode 333 and a plane_B mode 335. The plane _A mode 333 and the plane_B mode 335 each comprise three bits. The plane_A mode 333 determines the mode for the Plane A 310. The plane_B mode 335 determines the mode for the Plane B 320.

The mode detector circuit 300 generates the plane _A mode 333 and the plane_B mode 335 according to the FAC control signals 234 from the flash array controller 50, the IC control signals 224 from the command state machine 210, and the test mode control signals 94.

The FAC control signals 234 comprise bit 7 of the FAC program counter, bit 8 of the FAC address bus 236, and the current FAC instruction.

The IC control signals 224 comprise bit 8 of the IC address bus 222, an IC plane status signal, and an IC plane select signal. The IC control signals 224 also comprise an FAC plane status signal, an FAC plane select signal, a single byte/word write signal, and a write sequential signal.

The test mode control signals 94 include an FAC control store enable signal, a test mode extend signal, and a 2 bit FAC override signal. The FAC control store enable signal determines whether the page buffer circuit 70 functions as a control store for the flash array controller 50. The test mode extend signal determines whether the page buffer circuit 70 functions in the extended modes 6–7. However, the FAC override signal if not equal to 00 overrides the IC and FAC plane status and plane select signals.

FIG. 9 illustrates the assignment of the Plane A 310 and the Plane B 320 for accesses by the flash array controller 50. The FAC plane assignment is determined by the FAC plane select signal, the FAC plane status signal, and the FAC override signal.

If bits 0 and 1 of the FAC override signal are both zero, the FAC plane select signal determines whether the flash array controller 50 is allocated the Plane A 310 or the Plane B 320. The FAC plane status signal indicates whether the plane determined by the FAC plane select signal is available.

The FAC override signal overrides the normal plane assignment mechanism and allocates either the Plane A 310 or the Plane B 320 to the flash array controller 50.

FIG. 10 illustrates the assignment of the Plane A 310 and the Plane B 320 for accesses by the interface circuit 40. The plane assignment for the interface circuit 40 is determined by the IC plane status signal, the IC plane Select signal, and the test mode extend signal.

If the test mode extend signal is asserted, the interface circuit 40 accesses to the Plane A 310 and the Plane B 320 including the remnant bits in the extended memory space.

If the test mode extend signal is not asserted, the IC plane select signal determines whether the interface circuit 40 is allocated the Plane A 310 or the Plane B 320. The IC plane status signal indicates whether the plane selected by the IC plane select signal is available.

The command state machine 210 generates the IC plane status signal, the IC plane select signal, the FAC plane status signal, and the FAC plane select signal to allocate the Plane A 310 and the Plane B 320 to the flash array controller 50 and the interface circuit 40. The command state machine 210 generates the IC and FAC plane status and plane select signals to ensure that the Plane A 310 is not concurrently allocated to both the flash array controller 50 and the interface circuit 40. Similarly, the command state machine 210 generates the IC and FAC plane status and plane select signals to ensure that the Plane B 320 is not concurrently allocated to both the flash array controller 50 and the interface circuit 40.

The mode detector circuit 300 also generates an FAC byte signal 352. The FAC byte signal 352 indicates whether the flash array controller 50 is performing a byte or a word access to the page buffer circuit 70. The mode detector circuit 300 determines the byte or word access by decoding the current FAC instruction.

The column select circuit 302 receives the plane_A mode 333 and the plane _B mode 335, and the FAC byte signal 352 from the mode detector circuit 300. The column select circuit 302 also receives an IC byte signal 344. The IC byte signal 344 indicates whether the user is performing a byte or a word access of the page buffer circuit 70. Byte or word accesses from the user are determined by a control input pin coupled to the user control bus 106.

The column select circuit 302 receives bit 0 of the IC address bus 222 over a signal line 346, and bit 9 of the IC address bus 222 over a signal line 348. The column select circuit 302 receives bit 0 of the FAC address bus 236 over a signal line 350.

The column select circuit 302 generates a three bit plane_A select 337 and a three bit plane_B select 339. The plane_A select 337 provides column select signals for the Plane A 310. The plane_B select 339 provides column select signals for the Plane B 320.

FIG. 11 is a truth table showing the states of the plane_B select 339 generated by the column select circuit 302. The plane_B select 339 is determined by the plane_B mode 335, the FAC override signal, the FAC address bit 0, the IC address bits 9 and 0, the FAC byte signal 352, and the IC byte signal 344.

FIG. 12 is a truth table showing the states of the plane_A select 337 generated by the column select circuit 302. The plane_A select 337 is determined by the plane_A mode 333, the FAC override signal, the FAC address bit 0, the IC address bits 9 and 0, the FAC byte signal 352, and the IC byte signal 344.

The Plane A 310 receives input data through the input multiplexer 304. The input multiplexer 304 receives data over the FAC data bus 232 from the flash array controller 50, and over the user data bus 104 from the user. The input multiplexer 304 is controlled by the plane_A mode 333.

In modes 2, 3, 6, and 7, the plane_A mode 333 causes the input multiplexer 304 to transfer input data from the user data bus 104 to the input of the Plane A 310. In modes 4 and 5, the plane_A mode 333 causes the input multiplexer 304 to transfer input data from the FAC data bus 232 to the input of the Plane A 310.

The Plane B 320 receives input data through the input multiplexer 306. The input multiplexer 306 receives data over the FAC data bus 232 from the flash array controller 50, and over the user data bus 104 from the user. The input multiplexer 306 is controlled by the plane_B mode 335.

In modes 2, 3, 6, and 7, the plane_B mode 335 causes the input multiplexer 306 to transfer input data from the user data bus 104 to the input of the Plane B 320. In modes 4 and 5, the plane_B mode 335 causes the input multiplexer 306 to transfer input data from the FAC data bus 232 to the input of the Plane B 320.

The Plane A 310 transfers output data over a plane_A data bus 340. The plane_A data bus 340 comprises 19 bits of data. The plane_A data bus 340 includes a high byte from column A, a low byte from column B, and 3 remnant bits from column C.

The Plane B 320 transfers output data over a plane_B data bus 342. The plane_B data bus 342 comprises 19 bits of data including a high byte from column A, a low byte from column B, and 3 remnant bits from column C.

Figure 13:
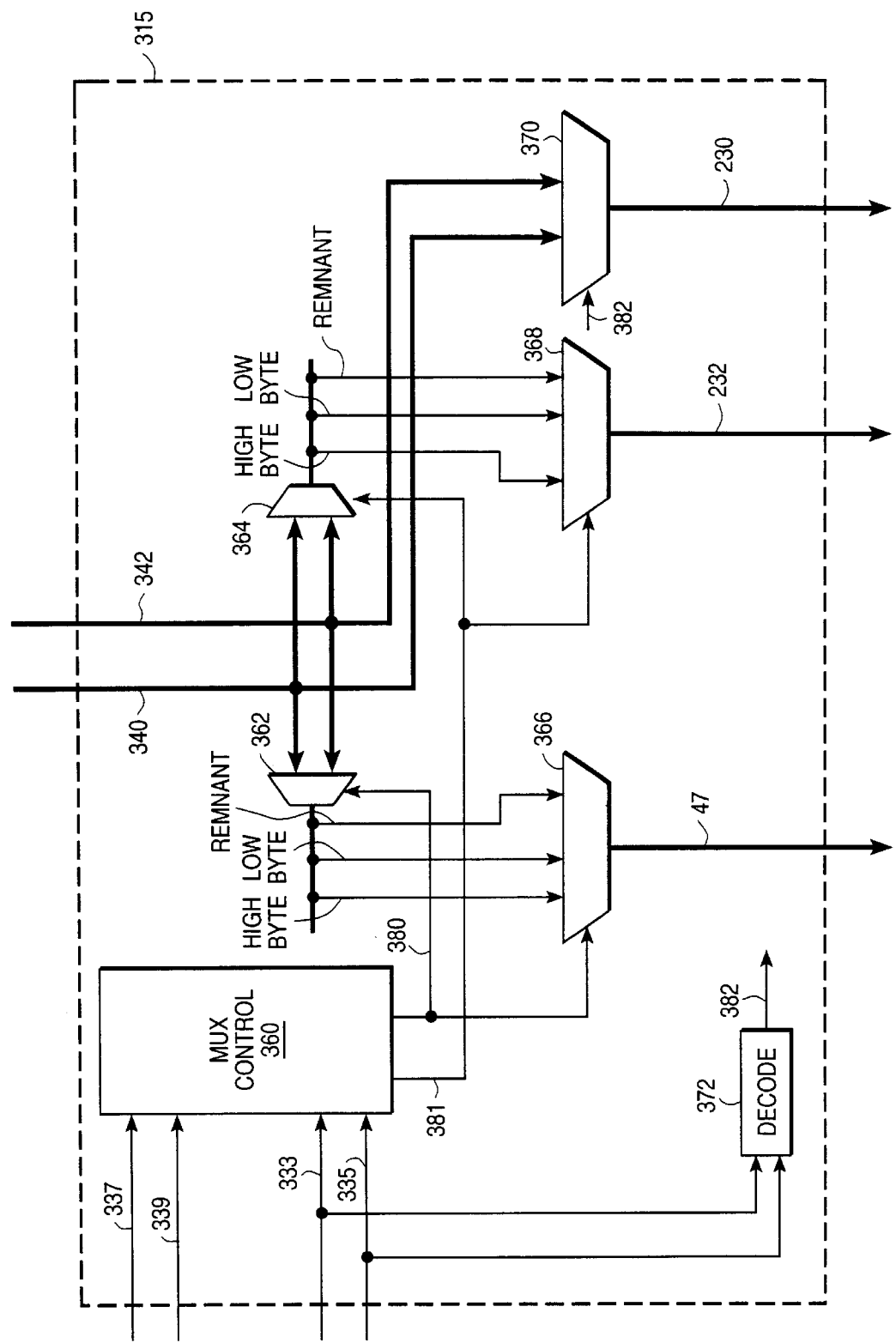
FIG. 13 illustrates the output data aligner circuit which transfers the output data from the Plane A and the Plane B over the FAC instruction bus, the FAC data bus and the page buffer data bus according to the mode.

FIG. 13 illustrates the output data aligner circuit 315. The output data aligner circuit 315 transfers the output data from the Plane A 310 and the Plane B 320 over the FAC instruction bus 230, the FAC data bus 232 and the IC data bus 47 according to the plane_A mode 333, the plane_B mode 335, the plane_A select 337, and the plane_B select 339.

The output data aligner circuit 315 receives output data over the plane_A data bus 340 and the plane_B data bus 342. The output data aligner circuit 315 is comprised of a multiplexer control circuit 360, a decode circuit 372, along with a set of multiplexers 362–370.

The multiplexer control circuit 360 receives the plane_A select 337, the plane_B select 339, the plane_A mode 333, and the plane_B mode 335. The multiplexer control circuit 360 generates a pair of multiplexer control signals 380 and 381.

The decode circuit 372 receives the plane_A mode 333 and the plane_B mode 335. The decode circuit 372 generates a multiplexer control signal 382.

The multiplexer 362 selectively couples the Plane A data bus 340 and the Plane B data bus 342 to inputs of the multiplexer 366. The Plane A data bus 340 carries the high byte, the low byte and the remnant bits from the Plane A 310. The Plane B data bus 342 carries the high byte, the low byte and the remnant bits from the Plane B 320. The multiplexer 362 selectively couples the Plane A data bus 340 and the Plane B data bus 342 to the multiplexer 366 under control of the multiplexer control signal 380.

The multiplexer 366 selectively couples the received high byte, the received low byte and the received remnant bits to the IC data bus 47 under control of the multiplexer control signal 380. For one embodiment, the IC data bus 47 comprises 16 bits.

The multiplexer 364 selectively couples the Plane A data bus 340 and the Plane B data bus 342 to inputs of the multiplexer 368. The multiplexer 364 selectively couples the Plane A data bus 340 and the Plane B data bus 342 to the multiplexer 368 under control of the multiplexer control signal 381.

The multiplexer 368 selectively couples the received high byte, the received low byte and the received remnant bits to the FAC data bus 232 under control of the multiplexer control signal 381. For one embodiment, the FAC data bus 232 comprises 16 bits.

The multiplexer 370 receives output data from the Plane A 310 over the plane_A data bus 340, and output data from the Plane B 320 over the plane_B data bus 342. The multiplexer 370 selectively couples the Plane A or Plane B output data to the FAC instruction bus 230 under control of the multiplexer control signal 382. For one embodiment, the FAC instruction bus 230 comprises 19 bits including the high and low bytes from columns A and B and the three remnant bits from column C.

FIG. 14 is a truth table for the output data aligner circuit 315 that illustrates the data transferred over the IC data bus 47. The data transferred over the IC data bus 47 is determined by the plane_A mode 333, the plane_A select 337, the plane_B mode 335, and the plane_B select 339.

FIG. 15 is a truth table for the output data aligner circuit 315 showing the data transferred over the FAC data bus 232. The data transferred over the FAC data bus 232 is determined by the plane_A mode 333, the plane_A select 337, the plane_B mode 335, and the plane_B select 339.

FIG. 16 is a truth table for the output data aligner circuit 315 showing the data transferred over the FAC instruction bus 230. The data transferred over the FAC instruction bus 230 is determined by the plane_A mode 333 and the plane_B mode 335.

What is claimed is:

1. A method for providing a test mode for a page buffer circuit in a flash memory device, said method comprising the steps of:

an interface circuit of the flash memory device receiving a test command from a host over a host bus, the test command specifying an extended mode for the page buffer circuit;

the page buffer circuit, responsive to the test command, extending memory space mapped to a plurality of page planes in the page buffer circuit to a contiguous memory space accessible over the host bus.

2. A circuit for providing a test mode for a page buffer circuit in a flash memory device, said circuit comprising:

circuit for receiving a test command over a host bus, the test command specifying an extended mode for the page buffer circuit;

circuit for extending memory space mapped to a plurality of page planes in the page buffer circuit to a contiguous memory space accessible over the host bus.

3. A computer system comprising:

central processing means transferring a test command over a host bus;

flash memory device receiving the test command over the host bus and extending memory space mapped to an internal page buffer resource for access according to the test command.

4. A computer system comprising:

a bus:

a processor coupled to transfer a test command over said bus;

a page buffer coupled to receive the test command from said processor via said bus, said page buffer including a plurality of page planes overlappingly mapped to a memory space addressable by said processor:

responsive to the test command, said page buffer being configured to extend the memory space mapped to the plurality of page planes.

5. The computer system of claim 4 wherein said page buffer is further configured to extend the memory space mapped to the plurality of page planes such that the plurality of page planes are non-overlappingly mapped.

6. A method for operating a page buffer circuit in a flash memory device, said method comprising the steps of:

mapping host memory space to first and second page planes of the page buffer circuit such that the first and second page planes share at least one host address;

receiving in the flash memory device a command specifying a test mode for the page buffer circuit; and in response to the command, extending the host memory space mapped to first and second page planes of the page buffer circuit such that the first and second page planes do not share the at least one host address.

7. The method of claim 6 wherein said step of mapping host memory space to first and second page planes of the page buffer circuit such that the first and second page planes share at least one host address comprises the steps of:

mapping the first page plane to first range of host addresses; and mapping the second page plane to a second range of host addresses overlapping the first range of host addresses.

8. The method of claim 7 wherein said step of mapping the second page plane to a second range of host addresses overlapping the first range of host addresses comprises the step of mapping the second page plane to a second range of host addresses coextensive to the first range of host addresses.

9. The method of claim 7 wherein said step of extending the host memory space mapped to the first and second page planes comprises the step of remapping at least one of the first and second page planes so that the second range of host addresses does not overlap the first range of host addresses.

10. The method of claim 6 wherein said step of extending the host memory space mapped to first and second page planes of the page buffer circuit such that the first and second page planes do not share the host address comprises the step of remapping at least one of the first and second page planes such that the first and second page planes are mapped into a contiguous host memory spaces.

11. A flash memory device comprising:

a page buffer circuit including a plurality of page planes overlappingly mapped to a memory space addressable by a host processor;

an interface circuit configured to receive a test command from the host processor and to specify an extended mode for said page buffer circuit; and said page buffer circuit being configured to extend the memory space mapped to the plurality of page planes in response to specification of the extended mode.

12. The flash memory device of claim 11 wherein responsive to specification of the extended mode at least one of the plurality of page planes is remapped such that the plurality of page planes are mapped at non-overlapping regions of the extended memory space.

13. The flash memory device of claim 11 further comprising a flash array controller coupled to said page buffer circuit, said flash array controller being configured to address one of the plurality of page planes while another of the plurality of page planes is addressed by the host processor.

14. The flash memory device of claim 13, further comprising a command state machine configured to issue signals to said flash array controller and to said interface circuit to ensure that said flash array controller and said host processor do not simultaneously access a particular one of the plurality of page planes.

* * * * *

UNITED STATES PATENT AND TRADEMARK OFFICE
CERTIFICATE OF CORRECTION

PATENT NO.   : 5,835,927
DATED        : November 10, 1998
INVENTOR(S)  : Fandrich et al.

It is certified that error appears in the above-identified patent and that said Letters Patent is hereby corrected as shown below:

Column 6,
Line 66, delete "a" and insert -- two --.
Line 66, after "SRAM", insert -- 312, 322 --.

Signed and Sealed this

Fifth Day of August, 2003

JAMES E. ROGAN
*Director of the United States Patent and Trademark Office*